United States Patent [19]
Letavic et al.

[11] Patent Number: 6,133,591
[45] Date of Patent: Oct. 17, 2000

[54] SILICON-ON-INSULATOR (SOI) HYBRID TRANSISTOR DEVICE STRUCTURE

[75] Inventors: Theodore Letavic, Putnam Valley; Satyen Mukherjee, Yorktown Heights, both of N.Y.; Arno Emmerik, Malden; J. Van Zwol, Waalre, both of Netherlands

[73] Assignee: Philips Electronics North America Corporation, New York, N.Y.

[21] Appl. No.: 09/122,407

[22] Filed: Jul. 24, 1998

[51] Int. Cl.$^7$ .......................... H01L 33/00; H01L 29/74; H01L 31/111
[52] U.S. Cl. ..................... 257/139; 257/133; 257/134
[58] Field of Search ..................... 257/139, 133, 257/134

[56] References Cited

U.S. PATENT DOCUMENTS

| | | | |
|---|---|---|---|
| 4,939,566 | 7/1990 | Singer et al. | 357/41 |
| 5,246,870 | 9/1993 | Merchant et al. | 437/21 |
| 5,276,339 | 1/1994 | Fujishima | 257/127 |
| 5,412,241 | 5/1995 | Merchant | 257/409 |
| 5,455,442 | 10/1995 | Neilson et al. | |
| 5,838,026 | 11/1998 | Kitagawa et al. | |
| 5,869,850 | 2/1999 | Endo et al. | |
| 5,969,387 | 10/1999 | Letavic et al. | |

FOREIGN PATENT DOCUMENTS

| | | |
|---|---|---|
| 0144909B1 | 6/1985 | European Pat. Off. . |
| 0314221A2 | 5/1989 | European Pat. Off. . |
| 2295052A | 5/1996 | European Pat. Off. . |
| 685248A | 3/1994 | Japan . |

Primary Examiner—Stephen D. Meier
Attorney, Agent, or Firm—Steven R. Biren

[57] ABSTRACT

A silicon-on-insulator (SOI) hybrid transistor device structure includes a substrate, a buried insulating layer on the substrate, and a hybrid transistor device structure formed in a semiconductor surface layer on the buried insulating layer. The hybrid transistor device structure may advantageously include at least one MOS transistor structure and at least one conductivity modulation transistor structure electrically connected in parallel. In a particularly advantageous configuration, the MOS transistor structure may be an LDMOS transistor structure and the conductivity modulation transistor structure may be an LIGB transistor structure, with the hybrid transistor device being formed in a closed geometry configuration. This closed geometry configuration may have both substantially curved segments and substantially straight segments, with MOS structures being formed in the curved segments and conductivity modulation transistor structures being formed in the straight segments. Hybrid transistor device structures in accordance with the invention feature excellent operating characteristics in high current, high voltage circuit applications, and in particular in source-follower circuit applications.

5 Claims, 1 Drawing Sheet

SILICON-ON-INSULATOR (SOI) HYBRID TRANSISTOR DEVICE STRUCTURE

BACKGROUND OF THE INVENTION

The invention is in the field of Semiconductor-On-Insulator (SOI) devices, and relates more particularly to lateral SOI devices suitable for high-voltage applications.

In fabricating high-voltage power devices, tradeoffs and compromises must typically be made in areas such as breakdown voltage, size, "on" resistance and manufacturing simplicity and reliability. Frequently, improving one parameter, such as breakdown voltage, will result in the degradation of another parameter, such as "on" resistance. Ideally, such devices would feature superior characteristics in all areas, with a minimum of operational and fabrication drawbacks.

One particularly advantageous form of SOI device includes a semiconductor substrate, a buried insulating layer on the substrate, and a lateral MOSFET on the buried insulating layer, the MOSFET including a semiconductor surface layer on the buried insulating layer and having a source region of a first conductivity type, a channel region of a second conductivity type opposite to that of the first, an insulated gate electrode over the channel region and insulated therefrom, a lateral drift region of the first conductivity type, and a drain region of the first conductivity type laterally spaced apart from the channel region by the drift region.

A device of this type is shown in FIG. 1 common to related U.S. Pat. No. 5,246,870 (directed to a method) and U.S. Pat. No. 5,412,241 (directed to a device), commonly-assigned with the instant application and incorporated herein by reference. The device shown in FIG. 1 of the aforementioned patents is a lateral SOI MOSFET device having various features, such as a thinned SOI layer with a linear lateral doping region and an overlying field plate, to enhance operation. As is conventional, this device is an n-channel or NMOS transistor, with n-type source and drain regions, manufactured using a process conventionally referred to as NMOS technology.

More advanced techniques for enhancing high-voltage and high-current performance parameters of SOI power devices are shown in U.S. patent application Ser. No. 08/998,048, filed Dec. 24, 1997, commonly-assigned with the instant application and incorporated herein by reference. Yet another technique for improving the performance of a semiconductor power switch is to form a hybrid device, which combines more than one type of device into a single structure. Thus, for example, in U.S. Pat. No. 4,939,566, commonly-assigned with the instant application and incorporated herein by reference, a semiconductor switch is disclosed which is fabricated in a bulk semiconductor substrate and includes a lateral DMOS transistor and a lateral IGT in the same structure.

Thus, it will be apparent that numerous techniques and approaches have been used in order to enhance the performance of power semiconductor devices, in an ongoing effort to attain a more nearly optimum combination of such parameters as breakdown voltage, size, current-carrying capability and manufacturing ease.

In particular, circuit applications which require a source-follower configuration operating at high voltage with significant source-follower current flow present substantial challenges to device designers. Once advantageous approach to providing an SOI MOSFET device suitable for source-follower operation is disclosed in U.S. patent application Ser. No. 09/100,832, entitled LATERAL THIN-FILM SOI DEVICES WITH GRADED TOP OXIDE AND GRADED DRIFT REGION, filed Jun. 19, 1998, commonly-assigned with the instant application and incorporated herein by reference. While all of the foregoing structures provide varying levels of improvement in device performance, no one device or structure fully optimizes all of the design requirements for high-voltage, high-current operation, particularly in the source-follower mode.

Accordingly, it would be desirable to have a transistor device structure capable of high performance in a high-voltage, high-current environment, and which is particularly suitable for source-follower circuit applications in such an environment.

SUMMARY OF THE INVENTION

It is therefore an object of the present invention to provide a transistor device structure capable of high-performance in a high-voltage, high-current environment. It is a further object of the invention to provide such a transistor device structure which is particularly adaptable to operation in a source-follower circuit configuration in that environment.

In accordance with the invention, these objects are achieved in an SOI hybrid transistor device structure having a substrate, a buried insulating layer on the substrate, and a hybrid transistor device structure formed in a semiconductor surface layer on the buried insulating layer. The hybrid transistor device structure includes at least one MOS transistor structure segment and at least one conductivity modulation transistor structure segment electrically connected in parallel with the MOS transistor structure segment. By providing a hybrid transistor device structure having MOS and conductivity modulation transistor structure segments electrically connected in parallel and formed in a semiconductor surface layer on an insulating layer in an SOI device, operational advantages are obtained above and beyond those attainable with prior-art structures.

In a preferred embodiment of the invention, the hybrid transistor device structure is formed with a closed geometry configuration having at least one substantially curved segment and at least one adjacent substantially straight segment, with at least one MOS transistor structure segment formed in the curved segment and at least one conductivity modulation transistor structure segment formed in the straight segment.

In a further preferred embodiment of the invention the MOS transistor structure segment is an LDMOS transistor structure and the conductivity modulation transistor structure segment is an LIGB transistor structure.

Hybrid SOI transistor structures in accordance with the present invention offer a significant improvement in that a combination of favorable performance characteristics making the devices suitable for operating in a high-voltage, high-current environment, and in particular with a source-follower circuit configuration in that environment, are obtained.

These and other aspects of the invention will be apparent from and elucidated with reference to the embodiments described hereinafter.

BRIEF DESCRIPTION OF THE DRAWINGS

The invention may be more completely understood with reference to the following description, to be read in conjunction with the accompanying drawing, in which.

Figure 1:
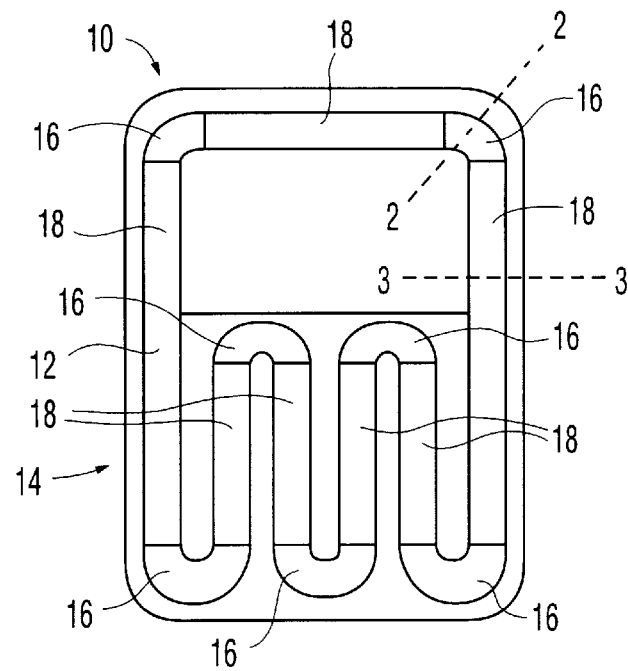
FIG. 1 shows a simplified plan view of an SOI hybrid transistor device structure in accordance with a preferred embodiment of the invention.

In the drawing, semiconductor regions having the same conductivity type are generally shown hatched in the same direction, and it should be noted that the figures are not drawn to scale.

DESCRIPTION OF THE PREFERRED EMBODIMENTS

As noted above, in fabricating high-voltage power devices, tradeoffs and compromises are typically made among different desirable operating parameters, since different device configurations and types offer different advantages and drawbacks. It has been found that SOI devices are particularly suited for high-power operation, and that within this class of devices MOS transistors can provide low conduction losses at low forward voltage and a reverse diode current flow when the drain voltage is less than the source voltage, whereas conductivity modulation devices such as LIGB transistors, can provide a high saturated current at high forward voltages, but lack the advantages of MOS SOI devices.

Accordingly, the present invention seeks to advance the state of the art in power device design by providing a parallel combination of MOS and conductivity modulation transistor structures in an advantageous manner in a single SOI device configuration.

A simplified plan view of such a hybrid structure is shown in FIG. 1. In FIG. 1, an SOI hybrid transistor device structure 10 is shown having a closed geometry transistor configuration 12 which is shown in outline form only. It will be understood that the simplified representation shown in the figures depicts one preferred embodiment, but that wide variations in both device geometry and configuration of the MOS and conductivity modulation transistor segments within that geometry are within the scope of the invention.

The closed geometry transistor configuration 12 in FIG. 1 is shown in this embodiment as having a serpentine-shaped segment 14, and both the serpentine-shaped segment and the remainder of the closed geometry configuration include both substantially curved segments 16 and substantially straight segments 18. It is emphasized that the closed geometry structure shown in FIG. 1 represents just one possible configuration, and that various other closed geometrical configurations are contemplated within the scope of the invention.

Figure 2:
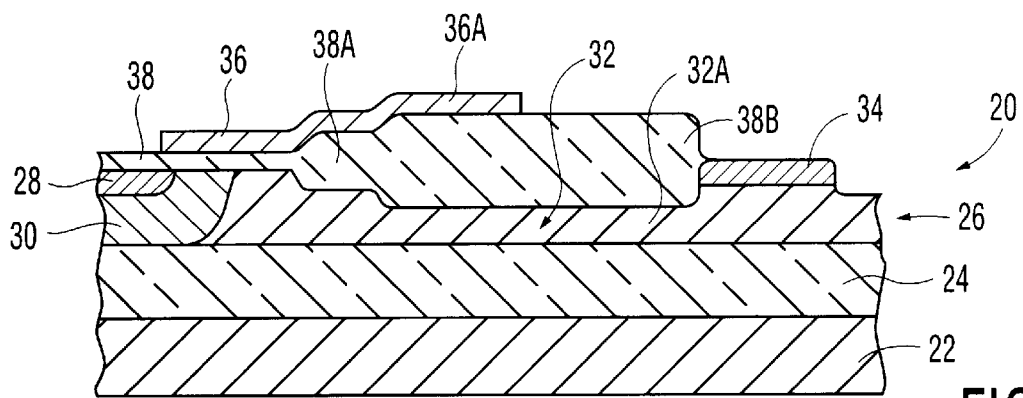
FIG. 2 shows a simplified cross-sectional view along the line 2—2 of FIG. 1.
Figure 3:
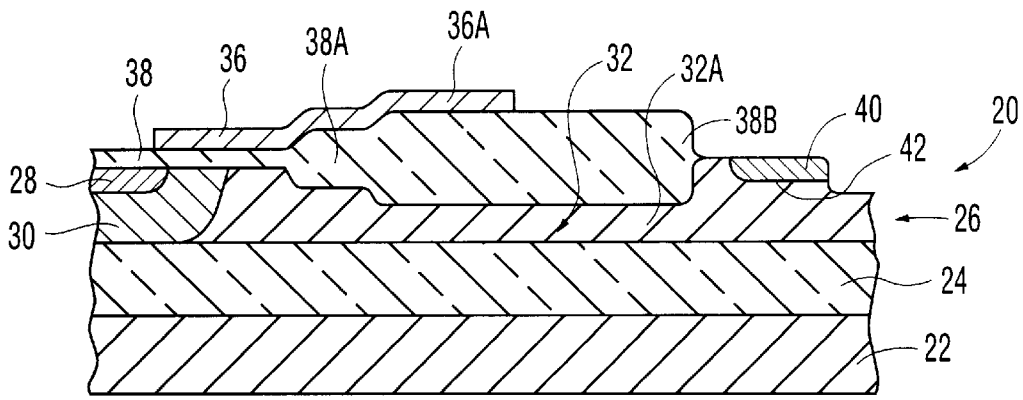
FIG. 3 shows a simplified cross-sectional view along the line 3—3 in FIG. 1.

In accordance with the invention, the hybrid transistor device structure 10 of FIG. 1 includes at least one MOS transistor structure segment and at least one conductivity modulation transistor structure segment electrically connected in parallel with the MOS transistor segment. In a particularly advantageous embodiment, MOS transistor structures, such as the representative LDMOS transistor structure 20 shown in simplified form in FIG. 2, are formed in the curved segments 16, and conductivity modulation transistor structures, such as the representative LIGBT structure 30 shown in FIG. 3, are provided in the substantially straight segments 18 of the structure shown in FIG. 1. It will be understood by those skilled in the art that the invention is a hybrid transistor device structure having at least one MOS transistor segment and at least one conductivity modulation transistor segment connected in parallel in an SOI device, and that many different device geometries and particular MOS and conductivity modulation transistor structures are useable within the scope of the invention. Accordingly, the representative, simplified LDMOS and LIGB transistor structures shown in FIG. 2 will be described in overview form only, with additional details regarding the configuration and fabrication of particular transistor devices being shown in the aforementioned prior art, incorporated herein by reference.

In the simplified cross-sectional view of FIG. 2, LDMOS SOI transistor 20 includes a semiconductor substrate 22, a buried insulating layer 24, and a semiconductor surface layer 26 in which the device is fabricated. The MOS transistor includes a source region 28 of one conductivity type, a body region 30 of a second, opposite conductivity type, a lateral drift region 32 of the first conductivity and a drain region 34, also of the first conductivity type. The basic device structure is completed by a gate electrode 36, insulated from the underlying semiconductor surface layer 26 by an oxide insulation region 38. Within the scope of the invention, the MOS transistor segments used in the present invention may have various performance-enhancing features, such as a stepped oxide region 38a, an extended gate electrode structure forming a field plate portion 36a, and a thinned lateral drift region portion 32a, all as detailed in the aforementioned prior art, or other performance-enhancing features as desired, without departing from the spirit or scope of the invention.

FIG. 3 shows a simplified, representative LIGBT structure 30 that can be formed in the straight segments 18 of the hybrid device 10 shown in FIG. 1. The device shown in FIG. 3 is in most respects similar to that shown in FIG. 2, with corresponding regions being provided with like reference numbers, so that only those portions of FIG. 3 which differ from FIG. 2 will be described further. In the LIGBT device of FIG. 3, the region 28 serves as the cathode region of the device, with the remaining portions of the device being the same as shown in FIG. 2 with the exception of the FIG. 2 drain region 34. In FIG. 3, drain region 34 of FIG. 2, of the same (first) conductivity type as the drift region 32, is replaced by an anode region 40, of opposite (second) conductivity type to that of the drift region 32. In this manner, a p-n junction 42 is formed between regions 32 and 40, thus converting the device to an LIGB transistor structure. As shown in FIG. 3, the region 40, unlike the region 34 of FIG. 2, should not extend at its left side to contact the oxide region 38b, as in FIG. 2, but rather should be spaced apart from this region, typically by at least three microns, in order to maintain optimum breakdown voltage characteristics. Again, it should be noted that various different forms of LIGB transistor structures are contemplated within the scope of the invention, and that the device shown in FIG. 3 is merely one exemplary embodiment.

While the LDMOS and LIGB transistor segments may assume various different configurations, and need not conform to the illustrative embodiments shown in FIGS. 2 and 3, it is noted that ease of manufacture is enhanced by employing a similar configuration for the two device types. Thus, the very similar devices of FIG. 2 and FIG. 3 can be fabricated using many of the same fabrication process steps, since the devices differ only in that anode region 40, having a different doping type and lateral extent, has been substituted for drain region 34.

It will be understood that like portions of the devices shown in FIGS. 2 and 3 will inherently be electrically connected, as they will form adjacent and continuous portions of the closed geometry configuration. Drain regions 34 of the DMOS transistor segments 20 and anode regions 40 of LIGB transistor 30 may advantageously be connected together with conventional metallization along the closed geometry configuration at the surface of these regions. In this manner, the two devices will be electrically connected in parallel.

It should also be understood that the percentage of the closed geometric configuration in FIG. 1 which is shown as curved (containing the MOS segments) and the percentage which is shown as straight (containing the LIGB segments) may be varied to secure different performance characteristics by causing one or the other of the two device performance characteristics to predominate. Alternatively, the percentage of curved and straight segments can be made approximately the same, in order to secure a balance of the favorable operating characteristics of each device type.

In this manner, the present invention provides an SOI hybrid transistor device structure capable of high-performance in a high-voltage, high-current environment. Devices in accordance with the invention are particularly adaptable to operation in a source-follower circuit configuration, where they can provide a substantial saving in device area as compared to presently-available circuit elements offering comparable performance.

While the invention has been particularly shown and described with reference to several preferred embodiments thereof, it will be understood by those skilled in the art that various changes in form and detail may be made without departing from the spirit or scope of the invention.

What is claimed is:

1. A silicon-on-insulator (SOI) hybrid transistor device structure, which comprises a substrate, a buried insulating layer on said substrate, and a hybrid transistor device structure formed in a semiconductor surface layer on said buried insulating layer, characterized in that said hybrid transistor device structure comprises at least one MOS transistor structure segment and at least one conductivity modulation transistor structure segment electrically connected in parallel with said MOS transistor structure segment, and in that said hybrid transistor device structure comprises a closed geometry configuration.

2. A silicon-on-insulator (SOI) hybrid transistor device structure as in claim 1, wherein said closed geometry configuration comprises at least one substantially curved segment and at least one adjacent substantially straight segment.

3. A silicon-on-insulator (SOI) hybrid transistor device structure as in claim 2, wherein said at least one MOS transistor structure segment is formed in said at least one substantially curved segment, and said at least one conductivity modulation transistor structure segment is formed in said at least one adjacent straight segment.

4. A silicon-on-insulator (SOI) hybrid transistor device structure as in claim 3, wherein said closed geometry configuration comprises a serpentine-shaped segment having substantially curved segments and substantially straight segments.

5. A silicon-on-insulator (SOI) hybrid transistor device structure as in claim 1, wherein said MOS transistor structure segment comprises an LDMOS transistor structure and said conductivity modulation transistor structure segment comprises an LIGB transistor structure.

* * * * *